US006860956B2

(12) United States Patent
Bao et al.

(10) Patent No.: US 6,860,956 B2
(45) Date of Patent: Mar. 1, 2005

(54) METHODS OF CREATING PATTERNS ON SUBSTRATES AND ARTICLES OF MANUFACTURE RESULTING THEREFROM

(75) Inventors: Lirong Bao, Bridgewater, NJ (US); Li Tan, Ann Arbor, MI (US); Xudong Huang, Singapore (SG); Yen Peng Kong, Singapore (SG); Lingjie Jay Guo, Ann Arbor, MI (US); Stella W. Pang, Ann Arbor, MI (US); Albert Yee, Singapore (SG)

(73) Assignees: Agency for Science, Technology & Research, Singapore (SG); The Regents of the University of Michigan, Ann Arbor, MI (US)

(*) Notice: Subject to any disclaimer, the term of this patent is extended or adjusted under 35 U.S.C. 154(b) by 68 days.

(21) Appl. No.: 10/444,505

(22) Filed: May 23, 2003

(65) Prior Publication Data

US 2004/0231781 A1 Nov. 25, 2004

(51) Int. Cl.⁷ .......................... B44C 3/08; B32B 31/20; B05D 3/10; B29C 33/00; C03C 17/30
(52) U.S. Cl. ...................... 156/232; 156/240; 156/247; 156/273.3; 156/289; 427/133; 427/146; 427/402; 427/407.1; 427/444; 264/219; 216/41; 216/49
(58) Field of Search ................................ 156/230, 232, 156/235, 240, 247, 272.2, 273.5, 289; 427/146, 147, 148, 133, 256, 258, 299, 402, 407.1, 407.2, 409, 444; 264/219, 338; 216/41, 49

(56) References Cited

U.S. PATENT DOCUMENTS

| | | | | |
|---|---|---|---|---|
| 5,425,848 A | * | 6/1995 | Haisma et al. ................. 216/48 |
| 5,512,131 A | * | 4/1996 | Kumar et al. ................. 438/738 |
| 6,027,595 A | * | 2/2000 | Suleski ........................ 156/230 |
| 6,380,101 B1 | * | 4/2002 | Breen et al. ................. 438/765 |
| 6,673,287 B2 | * | 1/2004 | Breen et al. ................... 264/83 |
| 6,780,492 B2 | * | 8/2004 | Hawker et al. .............. 428/198 |

OTHER PUBLICATIONS

L.R. Bao et al., "Polymer Inking as a Micro– and Nanopatterning Technique," *J. Vac. Sci. Technol. B*, 21(6), Nov./Dec. 2003, American Vacuum Society, pp. 2749–2754.

* cited by examiner

*Primary Examiner*—J. A. Lorengo
(74) *Attorney, Agent, or Firm*—Winstead Sechrest & Minick P.C.

(57) ABSTRACT

Methods of creating patterns on substrates are presented, and articles of manufacture resulting therefrom. One method comprises applying a first surface energy modifier to an applicator to form a coating on the applicator; contacting the coating with a receiving member, the receiving member having a topography, the coating only contacting and remaining on at least some protrusions; exposing the first modified receiving member to a second surface energy modifier, thereby forming a second modified receiving member having surface modified recesses; applying a composition comprising a polymeric material to the second modified receiving member, the composition substantially conforming to the topography of the surface modified protrusions and the surface modified recesses; and contacting the composition-coated, surface modified protrusions with a substrate for a time and under conditions sufficient to transfer the polymeric material on protrusions to the substrate. Because the surface energy of the sidewalls is lower than that on the protrusions, polymer dewetting from the sidewalls is promoted, which makes the polymer film discontinuous along the edges of patterns. Therefore, inked polymer patterns from the protrusions of the mold show very smooth edges and smaller dimensions compared to that of the mold.

22 Claims, 7 Drawing Sheets

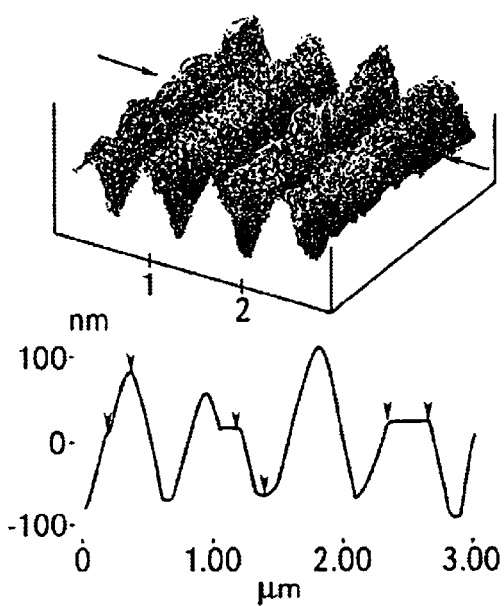 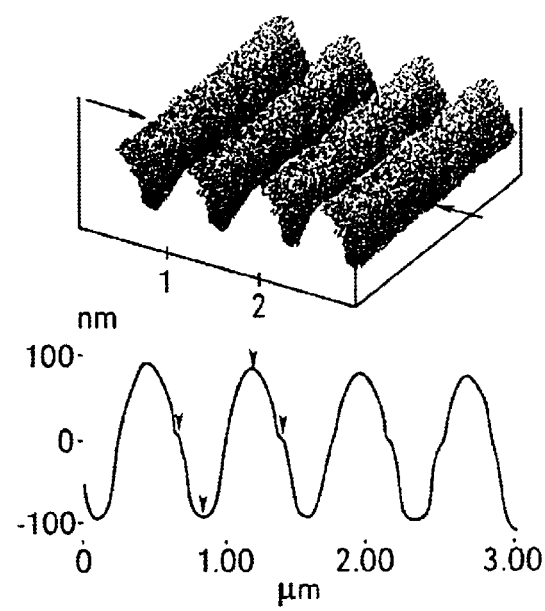
Fig. 4A
Fig. 4B

METHODS OF CREATING PATTERNS ON SUBSTRATES AND ARTICLES OF MANUFACTURE RESULTING THEREFROM

BACKGROUND INFORMATION

1. Technical Field

The invention is generally related to the field of creating patterns on substrates. More specifically, the invention relates to patterning substrates with polymeric materials having submicrometer-scale or nanometer-scale features.

2. Background Art

The trend in the semiconductor IC industry is to make devices smaller, faster and cheaper through very high degree of integration. The ever shrinking device geometry has come to a bottleneck due to the limitation of the available lithography technology that is used to define the device minimum feature sizes.

In recent years a number of patterning techniques have been developed to overcome the resolution limit of photolithography. Among these newly developed methods, microcontact printing ($\mu$CP) and nanoimprint lithography (NIL) are two high throughput and low cost patterning techniques. Microcontact printing ($\mu$CP) typically utilizes a soft polydimethylsiloxane (PDMS) mold or stamp to print self-assembled monolayer patterns using appropriate small molecule inks. The SAM patterns can be transferred to a substrate through special wet etching processes, but are not robust enough to be used as the barrier layer in dry etching. On the other hand, NIL forms a thickness contrast by deforming a thermoplastic polymer film under high pressure at elevated temperature. Because significant polymer flow is required during NIL processes, very high temperature and pressure are needed. After imprinting, a residual polymer layer is left in recessed regions. An additional etching step is required to remove this residual layer before the patterns can be transferred to the substrate. For discussion of $\mu$CP and NIL, please see Wilber, J. L., Kumar, A., Kim, E., and Whitesides, G. M., "Microfabrication by Microcontact Printing of Self-Assembled Monolayers", Adv. Mater., 1994, 6, No.7/8, 600–604; Chou, S. Y., Krauss, P. R., and Renstrom, P. J., "Nanoimprint Lithography", J. Va. Sci. Technol. B 14(6), November/December 1996, 4129–4133, and U.S. Pat. No. 6,309,580; Granlund, T, Nyberg, T., Roman, L. S., Svensson, M., and Inganas, O., "Patterning of Polymer Light-Emitting Diodes with Soft Lithography", Adv. Mater. 2000, 12, No. 4, 269–273; and WO 02/086452.

Yet another method, termed reversal imprinting, has been described in the literature by authors including some of the present inventors. During reversal imprinting, a polymer film is spin coated onto a patterned mold and then transferred to a substrate at suitable temperature and pressure. When the mold surface is not planarized after spin coating, the polymer film on the protruded surfaces of the mold can be inked to the substrate. However, because a polymer film continually covers a patterned mold after spin coating, the inked patterns usually display ragged edges due to forced breakage of the polymer film near feature sidewalls. Although using a deep mold coated with a relatively thin coating may alleviate this problem, improvement of the technique would be preferred to reduce edge roughness. See X. D. Huang, L. R. Bao, X. Cheng, L. J. Guo, S. W. Pang, and A. F. Yee, J. Vac. Sci. Technol. B 20, 2872 (2002).

Patent Cooperation Treaty published patent application WO 00/70406 describes methods for patterning polymer films. The document describes selective surface treatment of protrusions of a polymeric transfer member with a plasma etch to modify adhesion between the transfer member and the polymer film. In one described method, a polymer film is contacted with protrusions on a plasma-treated transfer member, and portions of the film torn from the whole layer and transferred to a substrate. Very rough edges resulted, and the process can only be practiced with paste-like materials having very low cohesive strength. It is noted that plasticizers are required to be added to the polymer to assist the process, so that the process is not transferring true polymeric ink. It is further noted that the transfer member used was made from a low modulus of elasticity polydimethylsiloxane material, rather than a material having a high modulus of elasticity.

There is a need in many arts, particularly electronics arts, to be able to create sharp, regular or non-regular patterns reproducibly on many substrates, patterns that are not easily removed and that do not change significantly in topography over a wide variety of environmental conditions.

SUMMARY OF THE INVENTION

The present invention overcomes many deficiencies of the prior art in providing good quality, preferably sharp patterns on a variety of substrates. As used herein "sharp" means that the edges of the features of the printed polymeric pattern closely match the shape of the transfer member. While the edges themselves may be sharp in the usual definition of the word, this is not strictly required. In fact in some embodiments, the printed polymeric ink features have rounded edges, yet they are sharp in that they closely match the transfer member shape.

In accordance with an embodiment of the present invention, methods of creating a pattern on a substrate are presented, having feature sizes that are submicrometer-sized, or even nanometer-sized, the methods comprising the steps of:

a) applying a first surface energy modifier (e.g. a silane) to an applicator (e.g., a polyorganosiloxane) to form a coating of the first surface energy modifier on the applicator;

b) contacting the coating with a transfer member (e.g., a hard mold containing a desired pattern or relief for a micro-/nano-structure), the transfer member having a topography comprising a plurality of protrusions and a plurality of recesses, the coating only contacting and remaining on at least some of the protrusions but not any of the recesses, thus forming a first modified transfer member having surface modified protrusions;

c) exposing the first modified transfer member to a second surface energy modifier (e.g., a silane different from the first silane), thereby forming a second modified transfer member having differential surface energy between the surface modified protrusions and surface modified recesses, wherein the second surface energy modifier creates a surface energy on the recesses that is lower than surface energy of the protrusions treated with the first surface energy modifier;

d) applying via an application process a composition comprising a polymer material (e.g., an acrylic polymer, such as poly(methyl methacrylate), or a polyester, such as a polycarbonate) to the second modified transfer member, the composition substantially conforming to the topography of the surface modified protrusions and the surface modified recesses after the application process to form composition-coated surface-modified protrusions and composition-coated surface modified recesses; and e) contacting the composition-coated surface modified protrusions with a substrate for a time and under conditions (e.g., near the glass transition temperature ($T_g$) of the polymeric material) sufficient to transfer the polymeric material from the protrusions of the transfer member to the substrate.

The first surface energy modifier may be a silane selected from the group described by formula $R_nSiX_{4-n}$, where R is a functional or nonfunctional group; X is a group which is reactive, and/or which is hydrolyzable into a group which is reactive, with a hydroxyl group, and n=1, 2 or 3. R may be an alkyl, partially or totally fluorinated alkyl, alkenyl or substituted or unsubstituted aryl, an epoxide group, an acrylyl group, a methacrylyl group, a mercaptan group, inter alia. X may be, for example, a chlorine atom or an alkoxy group, such as methoxy and ethoxy, inter alia. The silanes phenethyltrichlorosilane (PETS) and methacryloxypropyltrichlorosilane (MOPTS) were found to be particularly suitable for the present invention as the first silane. It will be appreciated, however, that other silanes would also be suitable.

The second surface energy modifier may be a silane having similar general formula as the first surface energy modifier, $R_nSiX_{4-n}$, where R is a functional or nonfunctional group; X is a group which is reactive, and/or which is hydrolyzable into a group which is reactive, with a hydroxyl group, and n=1, 2 or 3. R may be an alkyl, partially or totally fluorinated alkyl, alkenyl or substituted or unsubstituted aryl, an epoxide group, an acrylyl group, a methacrylyl group, a mercaptan group, inter alia. X may be, for example, a chlorine atom or an alkoxy group, such as methoxy and ethoxy, inter alia. The silane 1H,1H,2H,2H-perfluorodecyltrichlorosilane (FDTS) was found to be particularly suitable for the present invention as the second silane.

Applicators comprise an elastomer, which may be a polydimethylsiloxane, or a thermoplastic elastomer.

Transfer members comprise a hard mold formed from a material selected from the group consisting of semiconductors, dielectrics, polymers, metals and their combinations. Typically, the mold is formed in $SiO_2$ or Si on silicon (Si) wafer or material of substantially similar hardness, measured on the Mohs hardness or other standard scale, and patterned by optical lithography or electron beam lithography and subsequent dry etching.

Polymeric inks suitable for use in the present invention consist of relatively soft materials compared to the transfer member, including thermoplastic polymers, thermal/irradiative curable prepolymers, and glass or ceramic precursors and their combinations. Suitable thermoplastic polymers include carbon chain polymers and those whose backbones contain additional atoms such as oxygen, nitrogen, sulfur, or silicon (heterochain polymers). Those from the first class include polyolefins, such as polyethylene; diene polymers, such as polyisoprene; polyvinyls such as polyvinyl chloride; and acrylics, such as poly(methyl methacrylate) (PMMA). Polymers useful as inks from the heteroatom class include polyesters, including saturated and unsaturated polyesters. Suitable unsaturated polyesters include branched alkyd resins and linear or long-branched resins for casting with styrene monomer. Suitable saturated polyesters include terephthalates, polycarbonates, and polylactones.

Substrate materials include polymers, semiconductors, dielectrics, metals and their combinations. The substrate may have varied three-dimensional forms, including complex forms such as a network of pins perpendicular to a support or a grid in relief. The substrate may also bear a pattern produced, for example, by molding, etching through a mask, photolithography, x-ray lithography, and the like. The surface of the substrate may be smooth, coarse, or porous.

Another embodiment of the invention is a method of patterning a substrate, the method comprising the steps of:

a) applying a first surface energy modifier to an applicator to form a coating of said first surface energy modifier on the applicator;

b) contacting the coating with a transfer member, the transfer member having a topography comprising a plurality of protrusions and a plurality of recesses, the coating only contacting and remaining on at least some of the protrusions but not any of the recesses, thus forming a first modified transfer member having surface modified protrusions;

c) exposing the first modified transfer member to a second surface energy modifier, thereby forming a second modified transfer member having modified recesses and differential surface energy on the surface modified protrusions and surface modified recesses, wherein the second surface energy modifier creates a surface energy on a silicon wafer that is lower than surface energy of the same silicon wafer treated with said first surface energy modifier;

d) applying a composition comprising a polymeric material to the second modified transfer member, the composition substantially conforming to the topography of the surface modified protrusions and the surface modified recesses to form composition-coated, surface-modified protrusions and composition-coated surface modified recesses; and e) contacting the composition-coated, surface modified protrusions with a substrate immediately after step (d) or after annealing under external pressure and at a temperature slightly above $T_g$ of the polymeric material, thereby polymeric material dewets from sidewalls of the recesses where the surface energy is very low, while polymeric material on the protrusions dewets less severely due to both higher surface energy and confinement imposed by said external pressure.

Another embodiment of the invention is a method of forming high aspect ratio, polymer inked features on a substrate, the method comprising the steps of:

a) applying a first surface energy modifier to an applicator to form a coating of said first surface energy modifier on the applicator;

b) contacting the coating with a transfer member, the transfer member having a topography comprising a plurality of protrusions and a plurality of recesses, the coating only contacting and remaining on at least some of the protrusions but not any of the recesses, thus forming a first modified transfer member having surface modified protrusions;

c) exposing the first modified transfer member to a second surface energy modifier, thereby forming a second modified transfer member having modified recesses and differential surface energy on the surface modified protrusions and surface modified recesses, wherein the second surface energy modifier creates a surface energy on a silicon wafer that is lower than surface energy of the same silicon wafer treated with said first surface energy modifier;

d) applying a composition comprising a polymeric material to the second modified transfer member, the composition substantially conforming to the topography of the surface modified protrusions and the surface modified recesses to form composition-coated, surface-modified protrusions and composition-coated surface modified recesses, the polymeric material selected to have much higher dry etch resistance than an organic polymer layer on a substrate to which the polymeric material is applied in step (e);

e) contacting the composition-coated, surface modified protrusions with a substrate for a time and under conditions (preferably near the $T_g$ of the polymer) sufficient to transfer a pattern of the polymeric material from the transfer member to the organic layer on the substrate; and f) exposing the product of step (e) to reactive ion etching to extend the pattern to the organic layer.

Articles of manufacture resulting from the inventive methods are also considered within the inventive concepts, such as optical gratings, sensors, and the like.

Further aspects and advantages of the invention will become apparent by reviewing the description of embodiments that follows.

BRIEF DESCRIPTION OF THE DRAWING

For a more complete understanding of the present invention, and the advantages thereof, reference is now made to the following descriptions taken in conjunction with the accompanying drawings, which are representative illustrations and not necessarily to scale, and in which:

FIGS. 4a and 4b illustrate dewetting behavior of a poly (methyl methacrylate) ink from a 700 nanometer period grating transfer member under different conditions, FIG. 4a being with no selective surface energy treatment, and FIG. 4b being with selective surface energy treatment of the protrusions and recesses;

DETAILED DESCRIPTION

The inventors have developed unique polymer inking techniques and resulting articles of manufacture. The present inventive methods are termed "polymer inking" to emphasize that the patterning processes of the invention do not employ so-called small molecule inks. In the inventive processes, a polymer, such as PMMA, is applied, possibly spin coated, onto a patterned mold, referred to herein as a transfer member since the pattern is ultimately transferred to a substrate and a positive image of the pattern is obtained. Selective surface treatments (also referred to sometimes as differential surface energy treatments) have been developed with a goal being to improve the edge smoothness of the "inked" pattern. During selective surface treatment, protruded surfaces of the transfer member (referred to herein as protrusions) are first treated, such as with a flexible stamp (also referred to herein as an applicator) impregnated or simply coated with a silane to produce a medium energy surface on the protrusions. The transfer member is then exposed to a second surface energy modifier, such as with immersion in another silane solution, to treat the recesses or trenches of the transfer member and produce a surface energy lower than the first treatment. Because the surface energy of the sidewalls and bottoms of the recesses is lower than that of the protrusions, polymer dewetting from the sidewalls is promoted. Dewetting from the sidewalls causes the polymer to become discontinuous near the protrusion edges (also referred to herein as feature edges). Therefore, the polymer on the protrusion surface of the transfer member can be inked to the substrate with smooth edges.

Figure 1:
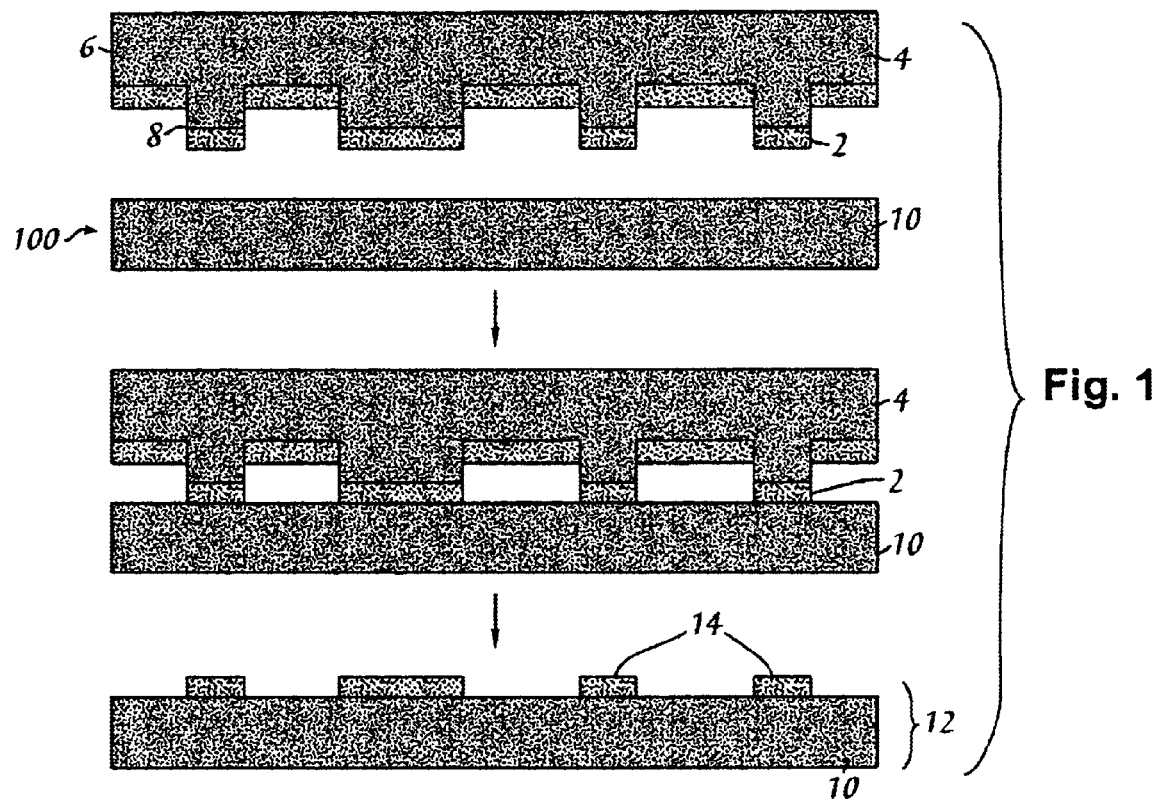
FIG. 1 is a schematic cross-section view of a substrate being inked by a transfer member in accordance with one process embodiment of the invention.

FIG. 1 illustrates a schematic cross-section view of a substrate being inked by a transfer member in accordance with one process embodiment of the invention, a polymer inking scheme, 100. A relatively thin film composition comprising a polymer 2 is applied to a patterned transfer member 4, such as by a method of application whereby recesses 6 and protrusions 8 are all coated, for example spin coating. Coated transfer member (2, 4) is then brought into contact with a substrate 10 and a suitable temperature and pressure are applied, for a suitable time, according primarily to the polymer characteristics. Polymer 2 on protrusions 8 is transferred to substrate 10 upon separation to form a patterned substrate 12, including transferred, or "inked" polymer 14 on substrate 10. Protrusions 8 can be treated (as explained more fully herein below) to have a relatively high surface energy relative to recesses 6 (also treated), This polymer inking technique has several advantages over other high throughput patterning techniques, such as $\mu$CP and NIL. The inking polymer can be selected to have higher dry etch resistance than a SAM layer. Furthermore, because of the absence of large scale polymer flow during inking, much lower temperatures and pressures than those required in NIL can be used. In addition, while NIL requires an additional etching step to remove the residual film in the imprinted regions (see S. Y. Chou, P. R. Krauss and P. J. Renstrom, Science 272, 85 (1996); S. Y. Chou, P. R. Krauss and P. J. Renstrom, J. Vac. Sci. Technol. B 14, 129 (1996); and R. W. Jaszewski, H. Shift, J. Gobrecht and P. Smith, Micorelectron. Eng. 42, 575 (1998)), only the material on the protrusions of the mold is transferred to the substrate in polymer inking, which considerably simplifies subsequent pattern transfer. The Examples section herein below discusses the behavior of polymer inking under different processing conditions, with emphasis on material selection and surface treatment.

Figure 2:
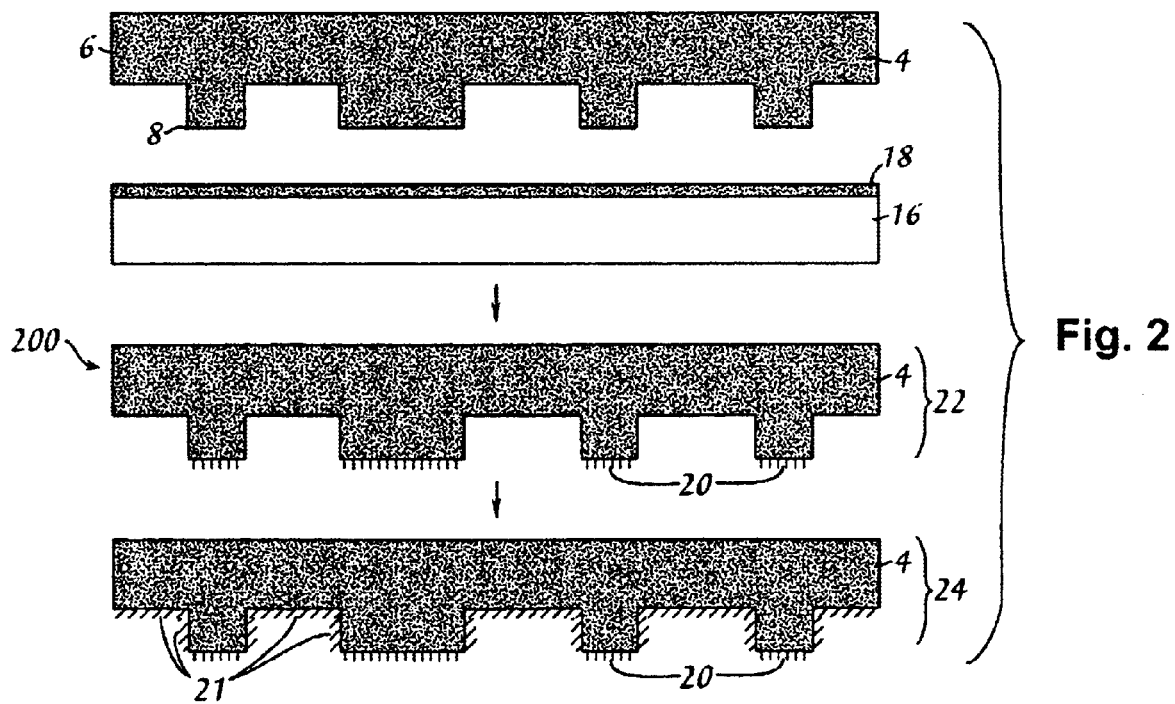
FIG. 2 is a schematic cross-section view of one method of modifying the surface energy of protrusions and recesses of a transfer member in accordance with the invention.

The inventors herein have developed a selective surface treatment technique to improve the edge smoothness of inked patterns. In a selective surface treatment, the protrusion surfaces and recess sidewalls are treated to have different surface properties. The function of the different treatments is to promote polymer dewetting near the sidewalls of a feature without causing undesired dewetting from the protrusions. FIG. 2 is a schematic cross-section view of one method 200 of modifying the surface energy of recesses 6 and protrusions 8 of transfer member 4 in accordance with the invention employing two different surface energy modifiers. A first surface energy modifier 18 is applied to an applicator 16. First surface energy modifier 18 functions to lower the surface energy of protrusions 8. First surface energy modifier 18 may be a silane, such as phenethyltrichlorosilane (PETS) or methacryloxypropyltrichlorosilane (MOPTS). First surface energy modifier 18 may be applied by any suitable means known in the coating art, such as swabbing, spraying, misting, brushing, spin coating, film deposition; and the like. Applicator 16 functions to temporarily hold first surface energy modifier 18 until it may be contacted with protrusions 8. This contact results in a first modified transfer member 22, comprising the original transfer member 4 and surface energy modified protrusions comprising a self-absorbed monolayer 20 of the first surface energy modifier. Note that very little, possibly no, first surface energy modifier 18 is transferred to recesses 6, and the reason for this will become apparent. First modified transfer member 22 is then exposed, possibly immersed in, a second surface energy modifier to form a second modified transfer member having recesses coated with a composition to form a self-assembled monolayer of second surface energy modifier 21. Second surface energy modifier 21 functions to lower the surface energy of the recesses (including substantially vertical side walls) to a value that is less than the surface energy of the protrusions after treatment with first surface energy modifier 18. Second surface energy modifier 21 may be a silane, with the proviso that it is different from first energy modifier 18. A second surface energy modifier may be 1H,1H,2H,2H-perfluorodecyltrichlorosilane (FDTS). The result is a second modified transfer member 24 having protrusions of moderate surface energy, and recesses with low surface energy. The low surface energy of the recesses causes a polymer to dewet easily from the sidewalls when heated to above $T_g$ of the polymer, while the polymer on the protrusions dewets less severely due to the relatively high surface energy. Therefore the polymer becomes discontinuous near the edges and can be inked to the substrate with smooth well-defined edges.

Figure 3:
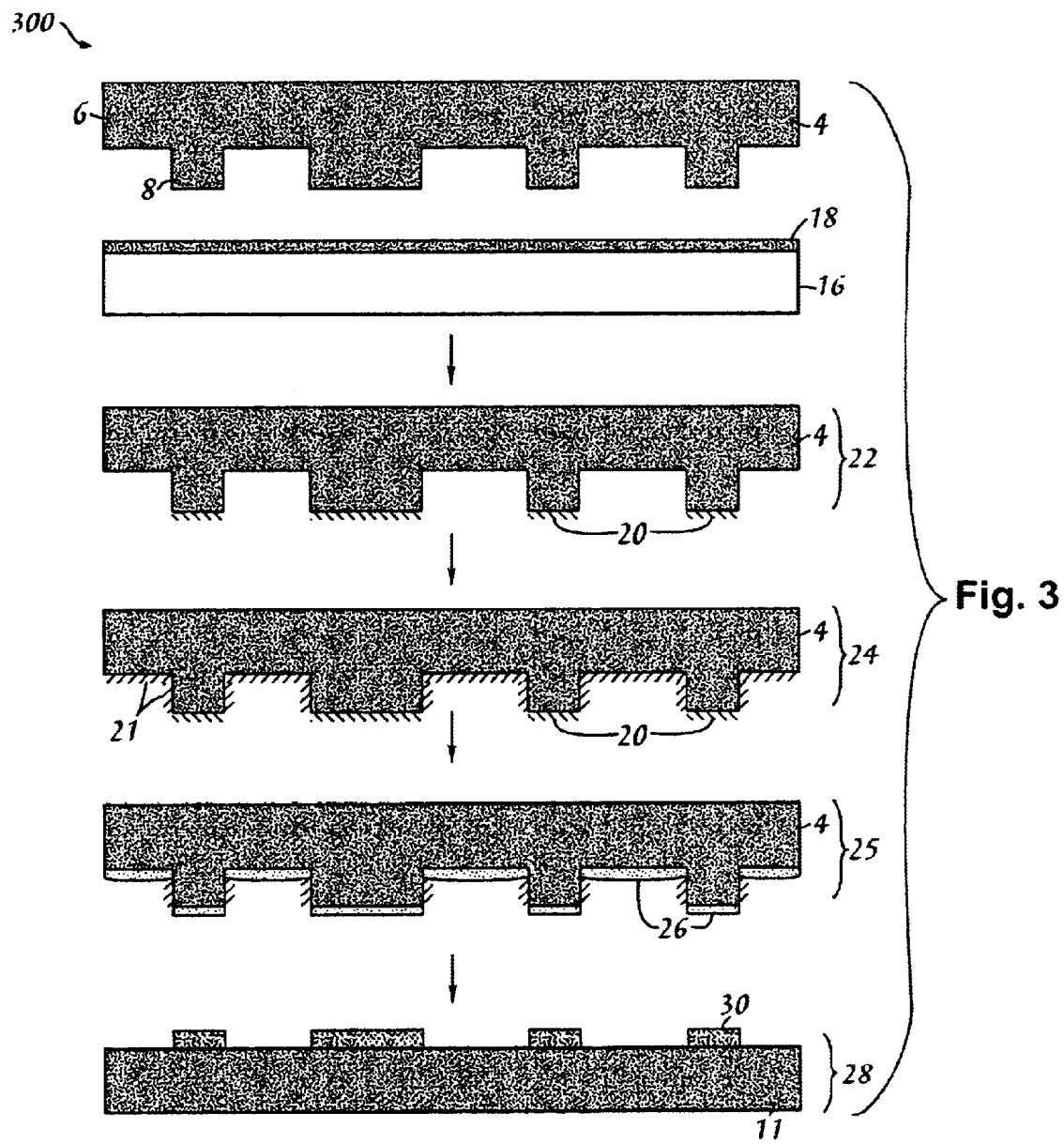
FIG. 3 illustrates a schematic cross-section of a process of inking a substrate in accordance with the invention.

FIG. 3 illustrates a schematic cross-section of a process 300 of inking a substrate in accordance with the invention. Applicator 16, coated with first surface energy modifier 18, is contacted with transfer member 4, as explained in reference to FIG. 2, and first modified transfer member 22 is exposed to second surface energy modifier 21, forming second modified transfer member 24. At this stage, a composition 26 comprising a polymeric material is applied over recesses 6 and protrusions 8. Composition 26 functions to fully cover recesses 6 and protrusions 8, and ultimately functions as the polymeric ink transferred from protrusions to a substrate. Composition 26 is applied via spin coating, although other coating methods may be employed with good results, such as brushing, spraying, rolling, and the like, the important parameter being that composition 26 substantially conforms to the topography of the surface modified protrusions and the surface modified recesses after the application process to form a modified transfer member 25 having composition-coated surface-modified protrusions and composition-coated surface modified recesses. Composition 26 comprises of a polymeric material (e.g., a poly(methyl methacrylate) or polycarbonate). A final inked substrate 28 is the result, having polymer ink 30 adhered to substrate 10.

The various chemical components of the inventive methods are now described in further detail.

A. First Surface Energy Modifiers

Surface energy modifiers function to change, usually decrease, the surface energy of surface they are applied to. As used herein, "surface energy modifier" is selected from chemical, physical, or combination treatments, with the proviso that at least one of the first and second surface energy modifiers, for protrusions and recesses, respectively, is a chemical, such as a liquid chemical, e.g., an organosilane. Therefore, the processes of the invention comprise using two different surface energy modification means for protrusions and recesses. All protrusions may be treated with the same surface energy modifier, but this is for convenience only, and is not a requirement of the invention.

Organosilanes useful as the first surface energy modifier include those described by formula $R_nSiX_{4-n}$ where R is a functional or nonfunctional group; X is a group which is reactive, and/or which is hydrolyzable into a group which is reactive, with a hydroxyl group, and n=1, 2 or 3. R may be an alkyl, partially or totally fluorinated alkyl, alkenyl or substituted or unsubstituted aryl, an epoxide group, an acrylyl group, a methacrylyl group, a mercaptan group, inter alia. X may be, for example, a chlorine atom or an alkoxy group, such as methoxy and ethoxy, inter alia. Mixtures of silanes within this formula may also be employed.

The silanes are generally utilized in the form of a liquid. This liquid may consist essentially of the silane in its liquid state or it may comprise the silane mixed with a non-polar organic solvent to form a solution. If a solvent is used, the solvent can be any suitable non-polar hydrocarbon or water insoluble chlorocarbon, which is a solvent for the chlorosilane. Exemplary of such solvents are saturated aliphatics such as dodecane, n-pentane, n-hexane, n-heptane and isooctane; aromatics such as benzene, toluene, and xylene; cycloaliphatics such as cyclohexane; halogenated aliphatics such as trichloroethylene, perchloroethylene and 3-chloropropane; and halogenated aromatics such as bromobenzene and chlorobenzene. Additionally, combinations of the above solvents may be used together as co-solvents for the chlorosilane. The non-polar organic solvents are aromatic compounds and of these toluene may be used.

B. Second Surface Energy Modifier

The second surface energy modifier may be a silane, but is different from the first surface energy modifier. The second surface energy modifier functions to decrease the surface energy of the recesses (including the walls of the recesses) so that the surface energy of the recesses is at least 10% lower than the surface energy of the treated protrusions. Utilized are perfluorochlorosilanes such as 1H,1H,2H,2H-perfluorodecyltrichlorosilane. This is exemplified in the data presented in Table 1.

TABLE 1

Surface Properties of Si wafers treated with different silanes

| Sample | Contact[1] angle/$H_2O$ | Contact[1] angle/$CH_2I_2$ | Surface[2] energy (mJ/m$^2$) |
|---|---|---|---|
| O2 plasma cleaned Si wafer | 26.9 | 47.7 | 65.2 |
| Si wafer treated with PETS[3] | 108.1 | 69.9 | 23.4 |
| Si wafer treated with PETS followed by FDTS[4] | 106.2 | 72.5 | 21.6 |
| Si wafer treated with MOPTS[5] | 73.6 | 58.7 | 34.6 |

TABLE 1-continued

Surface Properties of Si wafers treated with different silanes

| Sample | Contact[1] angle/$H_2O$ | Contact[1] angle/$CH_2I_2$ | Surface[2] energy (mJ/m$^2$) |
|---|---|---|---|
| Treated with FDTS | 103.0 | 99.8 | 11.7 |

[1]Static contact angle measured with a Rame-Hart Contact Angle Goniometer at room temperature
[2]Surface energy is calculated based on the measured contact angle results with a geometric-mean approach.
[3]phenethyltrichlorosilane
[4]1H,1H,2H,2H-perfluorodecyltrichlorosilane
[5]methacryloxypropyltrichlorosilane C. Applicator Materials The applicator functions as a vehicle to apply the first surface energy modifier chemical to the transfer member, wherein the first surface energy modifier is a liquid. Applicators comprise a flexible body, and have the ability to temporarily hold or swell in the presence of a liquid silane. Utilized are polysiloxanes. These polysiloxanes are molded, or coated on a flexible base member, and subsequently chemically crosslinked.

Over the years, a number of polysiloxane materials having different curing chemistries were developed. One of the first to find widespread acceptance was a composition comprising high molecular weight silanol terminal polydimethylsiloxane and a low molecular weight crosslinking copolymer of dimethyl and methyl siloxane. Heating the composition in the presence of organometallic catalysts effected cure. Although these siloxanes could be employed here, the polysiloxane coatings suffer from a number of drawbacks; it has to be applied from hydrocarbon solvents, and the cure is extremely slow, often requiring days for completion.

Several other polysiloxanes have become available, in which fast cure is triggered by exposure to ultraviolet radiation (UV). U.S. Pat. No. 4,359,369 (Gomowicz et al.) exemplifies such compositions and processes. U.S. Pat. No. 4,359,369 (Takamizawa et al.); U.S. Pat. No. 4,554,339 (Hockemeyer et al.); and U.S. Pat. No. 4,597,987 (Hockemeyer et al.) disclose oligomeric polydimethylsiloxanes substituted with pendant acryloxy alkyl groups which undergo rapid crosslinking using ultraviolet light sensitive photoinitiators in an inert atmosphere. In a similar fashion, U.S. Pat. No. 4,313,988 (Koshar et al.) and U.S. Pat. No. 4,822,687 (Kessel et al.) disclose polysiloxane compositions with pendant epoxy alkyl substituents which cure in seconds when super acids are generated from the UV catalyzed decomposition of certain onium salts. For these polysiloxane compositions, inerting of the coating is not necessary. In addition to the high speed of cure, these types of polysiloxane compositions offer the advantage of being completely stable before and during coating operations.

Another curing method which has proven useful for the preparation of polysiloxane applicators is the "moisture cure" of alkoxysilane functional polydiorganosiloxanes. In this system, atmospheric water is utilized to hydrolyze the alkoxy, especially trialkoxy, silane to —SiOH groups, which subsequently condense with other silanols or alkoxysilane groups to form —Si—O—Si—crosslinks. Certain tin compounds, such as dibutyl tin dilaurate catalyze these reactions. Although such materials are useful, they, like the condensation cure silicones, are found to cure too slowly to be practical in most manufacturing operations.

Homan et al. (U.S. Pat. Nos. 4,743,474; 4,530,882; and 4,525,566) have disclosed moisture curable silicone compositions consisting of mixtures of predominantly polydiorganosiloxanes having two or more terminal and/or pendant trialkoxysilyl substituents and lesser amounts of tetraalkyl titanate esters which provide silicone release coatings that cure exceptionally rapidly under ambient conditions.

D. Thermoplastic Elastomers as Applicators

Suitable flexible members are made from readily obtainable materials, such as conventional elastomers, and thermoplastic elastomers. Thermoplastic elastomers are generally the reaction product of a low equivalent weight polyfunctional monomer and a high equivalent weight polyfunctional monomer. "Thermoplastic elastomers" differ from "thermoplastics" and "elastomers" (a generic term for substances emulating natural rubber in that they stretch under tension, have a high tensile strength, retract rapidly, and substantially recover their original dimensions) in that thermoplastic elastomers, upon heating above the melting temperature of the hard regions, form a homogeneous melt which can be processed by thermoplastic techniques (unlike elastomers), such as injection molding, extrusion, blow molding, and the like. Subsequent cooling leads again to segregation of hard and soft regions resulting in a material having elastomeric properties, however, which does not occur with thermoplastics. Some commercially available thermoplastic elastomers include segmented polyester thermoplastic elastomers, segmented polyurethane thermoplastic elastomers, segmented polyurethane thermoplastic elastomers blended with other thermoplastic materials, segmented polyamide thermoplastic elastomers, and ionomeric thermoplastic elastomers. Examples of usable thermoplastic elastomers include those described in U.S. Pat. Nos. 5,427,595; 5,443,906; 5,460,883; 5,491,025; 5,518,794; 5,571,296; 5,616,411; 5,737,794; and 5,837,179, each of whose description of thermoplastic elastomers is incorporated by reference herein.

E. Transfer Member

The transfer member functions as a "master" to transfer the polymeric ink to a substrate in a specific pattern. Transfer members useful in the invention comprise a molded or shaped solid having a plurality of protrusions defining the pattern to be "inked", and comprise either a single material or composite. Modulus of the transfer member can be in the order of $10^{11}$ Pa (Si: $1 \times 10^{11}$ Pa; SiC: $4 \times 10^{11}$ Pa). The transfer member protrusions may be comprised of the same or different material as the bulk of the transfer member.

Suitable materials of construction for the transfer member include metals, dielectrics, semiconductors, polymeric materials, or combinations of the aforementioned. Examples of useful metals include nickel, steel, copper, and the like. Examples of dielectrics include glass and porcelain. Examples of useful semiconductors include silicon, silicon carbide, diamond, and quartz. Useful polymeric materials include thermosetting polymers, such as phenol-formaldehyde resin, epoxy resin thermoplastic materials, and the like, with the proviso that the $T_g$ of the polymeric materials is well above the $T_g$ of the polymeric ink to be transferred.

F. Polymeric Inks

Polymeric inks function to form the desired ink pattern on the substrate. The pattern is an optical grating, diode or other functional pattern, or may be an aesthetic pattern. Polymers suitable for use in formulating polymeric inks useful in the present invention are those capable of forming films that cleanly break away from the surface modified protrusions of the transfer member, especially near the edges of the protrusions. Polymers are capable of being spin-coated out of solution, at a variety of temperatures, but near room temperature (about 25° C.) and can be bonded to substrates using minimal pressure. The polymer may be thermoplastic, thermosetting, thermoplastic elastomer, and may be crosslinked, crosslinkable, or non-crosslinked. Finally, the polymer may be electrically conductive or non-conductive, or capable of being made conductive or non-conductive with additives, such as with addition of inorganic or organic fillers, fibers, or exotic materials such as carbon nanotubes (single-wall carbon nanotubes being used, either derivatized or non-derivatized).

Polymer inks suitable for use in the invention comprise acrylic polymers, polystyrene, or polycarbonate, and the like. Polymers with miscible additives, such as small molecules or another polymer, can also be polymer inks. Examples of acrylic polymers include acrylic or methacrylic acid esters having 1 to 20 carbon atoms in an alkyl group such as methyl methacrylate, ethyl methacrylate, isopropyl methacrylate, butyl methacrylate, and the like may be used. The weight average molecular weight of the polymers is preferably within the range of 10,000 to 5,000,000. Examples of polymer with miscible additives include polymer with plasticizers or polymer blends.

2. Crosslinking Agents and Other Additives

Acrylic-based and other suitable polymer-based inks may be crosslinked, tackified, or comprises additional physical property modifying additives. Suitable crosslinking additives include those operating through free-radical polymerization crosslinking of ethylenically unsaturated groups in the monomers, and through covalent or ionic crosslinking through chemical groups pending from the acrylic polymer backbones, for example, —COOH, and epoxy groups. Crosslinking agents that are usable in the present invention may be selected from the group consisting of polyisocyanate compounds, epoxide compounds, polyglycidylamines, ethyleneimine derivatives, metal salts of organic acids, and metal chelates of organic compounds. An example of the ethyleneimine derivative is an aziridine compound such as a bisamide. Examples of metal salts of organic acids are metal acetylacetonates of aluminum, zirconium, titanium, chromium, and the like. In certain circumstances it may be desired to tackify the polymeric ink. Phenolic resins have the effect of tackifying acrylic polymers, and can more easily impart suitable surface tack and color to polymeric inks useful in the present invention. The addition of the phenolic resins is optional, with amounts ranging from about 5 to 100 parts by weight on the basis of 100 parts by weight of the acrylic polymer, if used. "Non-phenolic" tackifiers, wherein "non-phenolic" means the tackifier is selected from rosins, terpenes, and hydrocarbon resin type tackifier, may also be employed. Suitable non-phenolic tackifiers include one or more abietic acid types such as abietic acid, and pimaric acid types, such as pimaric acid and isopimaric acid. Other additives may be appropriate for the polymeric inks, depending on the end use of the inventive articles of manufacture. For example, additives such as UV absorbers, anti-oxidants, viscosity increasing agents, inorganic particles, carbon nanospheres or nanotubes, and the like.

G. Substrates to be "Printed"

Substrate 10 comprises a material selected from the group consisting of metals, semiconductors, dielectrics, polymers and their combinations. As long as the material is able to withstand the pressure and temperature requirements of printing the polymeric ink, this is the only real requirement. Examples of useful metals include nickel, steel, copper, and the like. Suitable semiconductors include silicon and gallium arsenide wafers. Suitable dielectrics include glass and porcelain. Suitable polymer materials include polyimides, poly(ethylene terephthalate, poly(ethylene naphthalate), and the like, with the proviso that the $T_g$ of the polymeric materials is well above the $T_g$ of the polymeric ink to be transferred.

The substrate may have varied three-dimensional forms, including complex forms such as a network of pins perpendicular to a support or a grid in relief. The substrate may also bear a pattern produced, for example, by molding, etching through a mask, photolithography, x-ray lithography, and the like. The surface of the substrate may be smooth, coarse, modeled or porous.

H. Primer Layer

In some instances, the resin for forming the printed features is adhesively incompatible with the desired substrate material. For example, bonding of a polyester substrate to PMMA ink is not easy and further, when a pigment such as titanium oxide is added to the substrate or ink, bonding becomes more difficult. Since pigments generally contain impurities such as acids and alkalis, these impurities can migrate to the polymeric ink and promote curing of the resin, for example, inviting thereby the problem of the reduction of the open time (time period between application of the polymeric ink and curing of the polymeric ink). When the colored substrate is primed either physically or chemically, however, these problems can effectively be overcome.

In the present invention, a chemical primer layer or a corona treatment layer is disposed between substrate 10 and a polymeric ink layer 30. When a chemical primer layer and/or corona treatment is employed, inter-layer adhesion between substrate 10 and polymeric ink layer 30 can be improved, and thus high adhesion of the ink to a substrate is possible.

Suitable chemical primer layers may be selected from urethanes, silicones, epoxy resins, vinyl acetate resins, ethylenemines, and the like. The urethane and the silicone types are particularly effective chemical primers for polyester colored substrates. Among the silicone type, the primer layer having a continuous gelled network structure of inorganic particles, which is described in Japanese Unexamined Patent Publication (Kokai) No. 2-200476, is suitable for the present invention. This is because it has particularly remarkable affinity for polyester resins and polyolefin resins. Examples of chemical primers for vinyl and polyethylene terephthalate include crosslinked acrylic ester/acrylic acid copolymers disclosed in U.S. Pat. No. 3,578,622.

The thickness of the chemical primer layer is suitably within the range of 10 to 3,000 nanometers (nm). If the thickness is less than 10 nm, the primer effect is minimal and if it exceeds 3,000 nm, on the other hand, inter-layer peel is likely to occur in the primer layer.

Corona treatment is physical priming that can be suitably applied to the surface of the substrate onto which is then printed the polymeric ink. The corona treatment not only improves the inter-layer adhesion between the polymeric ink and the substrate but provides the advantage in the production process in that it can be separately applied to the substrate immediately prior to contacting modified transfer member 25 and substrate 10 (FIG. 3).

The corona treatment can be suitably carried out in a nitrogen atmosphere because the duration effect of the improvement of the inter-layer adhesion is high. Corona treatment of films is a well-known technique, and is described generally in Cramm, R. H., and Bibee, D. V., "The Theory and Practice of Corona Treatment for Improving Adhesion", TAPPI, 65, No. 8, 75–78 (August 1982).

EXAMPLES

The invention will be described more concretely with reference to the following examples. All parts and percentages are by weight unless otherwise specified.

General Procedure

The molds (transfer members) used were made of $SiO_2$ on Si wafers and the $SiO_2$ patterned by photolithography. Planar PDMS stamps (applicator) for surface treatment were formed by curing a siloxane prepolymer known under the trade designation Sylgard® 184 in a plastic petri dish. In a typical selective surface treatment experiment, the planar PDMS stamp was immersed for 15 to 30 seconds in a 20 millimolar (mM) solution of the appropriate silane dissolved in toluene. After it was removed from the solution and dried, the stamp was brought into contact with the mold for 2 minutes. The elastomeric stamp intimately contacted the mold without any need of external pressure. After being separated from the stamp, the mold was rinsed, dried and immersed into a solution of 1H,1H,2H,2H-perfluorodecyltrichlorosilane (FDTS) dissolved in heptane (about 10 mM). FDTS reacted with the recessed surfaces of the mold and formed a SAM layer with extremely low surface energy. (See T. Bailey, B. J. Choi, M. Colburn, M. Meissl, S. Shaya, J. G. Ekerdt, S. V. Sreenivasan and C. G. Willson, J. Vac. Sci. Technol. B 18, 3572 (2000)).

After surface treatment, the mold was spin coated with a polymer solution. The coated mold was then baked at appropriate temperature to remove residual solvent or to induce controlled dewetting of the polymer film. Finally, the film on the mold was inked to a flat Si wafer at a temperature close the $T_g$ under 5 MPa pressure. The topography of the spin-coated molds and the inked patterns were studied by contact mode atomic force microscopy (AFM) or scanning electron microscopy (SEM).

Two silanes were used in the examples to treat the protrusions, phenethyltrichlorosilane (PETS) and methacryloxypropyltrichlorsilane (MOPTS). The surface properties of Si wafers treated with different silanes are listed in Table 1.

Example 1

Figure 4C:
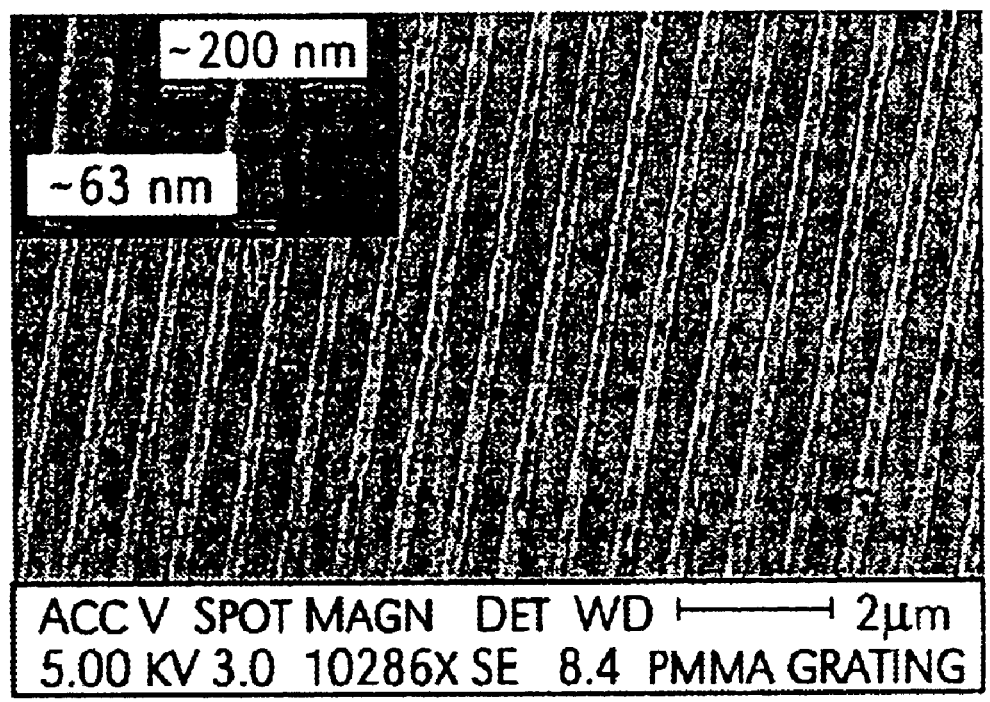
FIG. 4c is a SEM photograph of a poly(methyl methacrylate) ink formed by inking the pattern of FIG. 4b onto a silicon wafer.

FIG. 4 demonstrates the effect of selective surface treatment on polymer dewetting on a patterned mold. A 700 nanometer (run) period grating mold was spin coated with 4.5% poly(methyl methacrylate) (PMMA) (Mw=15,000 and $T_g$=105° C.) solution in toluene and then baked at 130° C. for 5 minutes. In FIG. 4(a), the mold was treated with FDTS solution alone. Because of the low surface energy of the FDTS treated surface, the PMMA film dewetted on the protruded surfaces and broke up into elongated droplets. In contrast, the mold in FIG. 4(b) was treated with selective PETS/FDTS as taught in accordance with the present invention. As the surface energy of the sidewalls was very low, the film dewetted near the edges of the protrusions. However, because of the higher surface energy of the PETS treated top surface of the protrusions, the film is continuous on the protrusions. The dewetted polymer lines were slightly narrower than the features on the mold. The polymer islands illustrated in FIG. 4(b) were easily transferred to a Si wafer at 105° C. and 5 MPa. FIG. 4(c) is the SEM image of the transferred PMMA grating pattern. The inked PMMA lines had straight and smooth edges. While the PMMA film on the protrusions of the mold shows a slight variation in polymer thickness, such variation was significantly reduced after inking under elevated pressure.

After annealing and inking, the inked patterns were usually slightly smaller than those on the mold due to dewetting of the polymer film near the feature edges. Although not meaning to be tied to any particular theory, it is surmised that this was because when a thin polymer film undergoes annealing at a temperature above its $T_g$, the polymer film gradually relaxes to a lower free energy state, which is determined by the surface properties of the polymer and substrate and the entropic state of the polymer. When the thickness of the PMMA film is comparable to the lateral dimensions of the submicrometer feature, the corresponding dewetted polymer dimensions are smaller (~10%) than those of the mold as shown in FIG. 4. Further investigation of the PMMA dewetting on protrusions of micrometer-sized mold shows that such pattern shrinkage after annealing starts from the edges of the features, and the resulting dimension change is around 20%.

Example 2

Figure 5A:
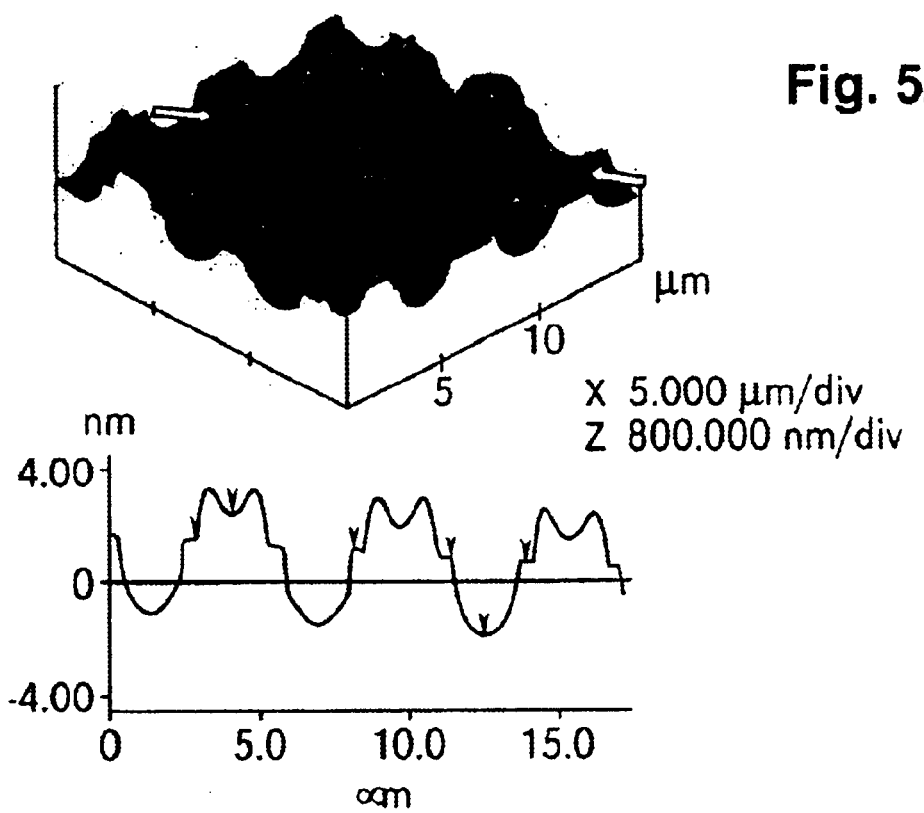
FIG. 5a illustrates dewetting behavior of a poly(methyl methacrylate) ink from a 450 nanometer deep transfer member with selective surface energy treatment of the protrusions and recesses.

FIG. 5 shows PMMA inking results with selective MOPTS/FDTS treatment. After spin coating and annealing, the PMMA film on the mold displayed an interesting feature as illustrated in the AFM scan in FIG. 5(a). A raised rim surrounded the PMMA island on top of the protrusions. Similar behavior is also observed on PETS/FDTS treated mold. The raised rim was likely formed by material retracting from the edge of the feature. During annealing, the thin polymer film on the sidewalls started to dewet first. The PMMA film retracted toward both the bottom of the trench and the protruded surface. Because of the higher energy of the protruded surfaces, the bulk of the PMMA film at the interface with the protrusions was immobilized. The retracted film piled up near the edge of the feature until the least interaction potential between PMMA and the surface is reached. Dewetting with this mechanism caused causes the film to shrink into a plateau surrounded with a rim and a pattern dimension change of ~20% before inking.

Figure 5B:
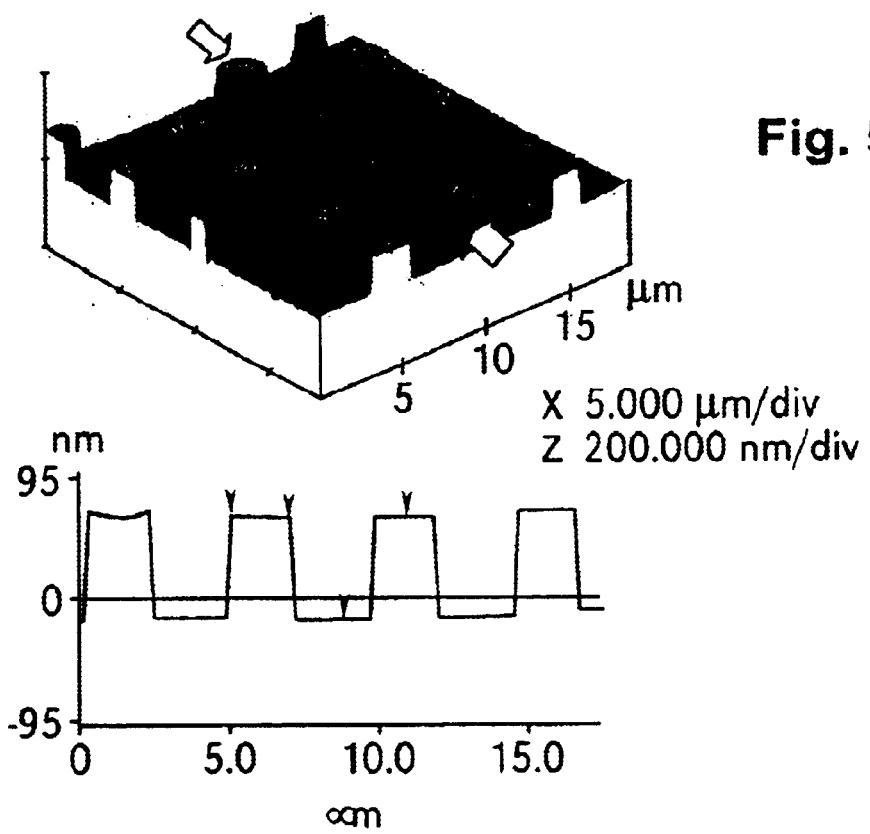
FIG. 5b is a SEM photograph of a poly(methyl methacrylate) ink formed by inking the pattern of FIG. 5a onto a silicon wafer.

The polymer islands in FIG. 5(a) were transferred to the substrate at 115° C. under elevated pressure of 5 MPa. An inking temperature slightly higher than $T_g$ is required to flatten the raised rim and ensure good contact between the PMMA film and substrate. FIG. 5(b) is an AFM scan of the transferred pattern. Smooth feature edges were obtained with controllable changes in the dimensions of the features. The inked patterns are 2 $\mu$m in diameter compared to the 3 $\mu$m protruded circles in the mold.

Example 3

Figure 6A:
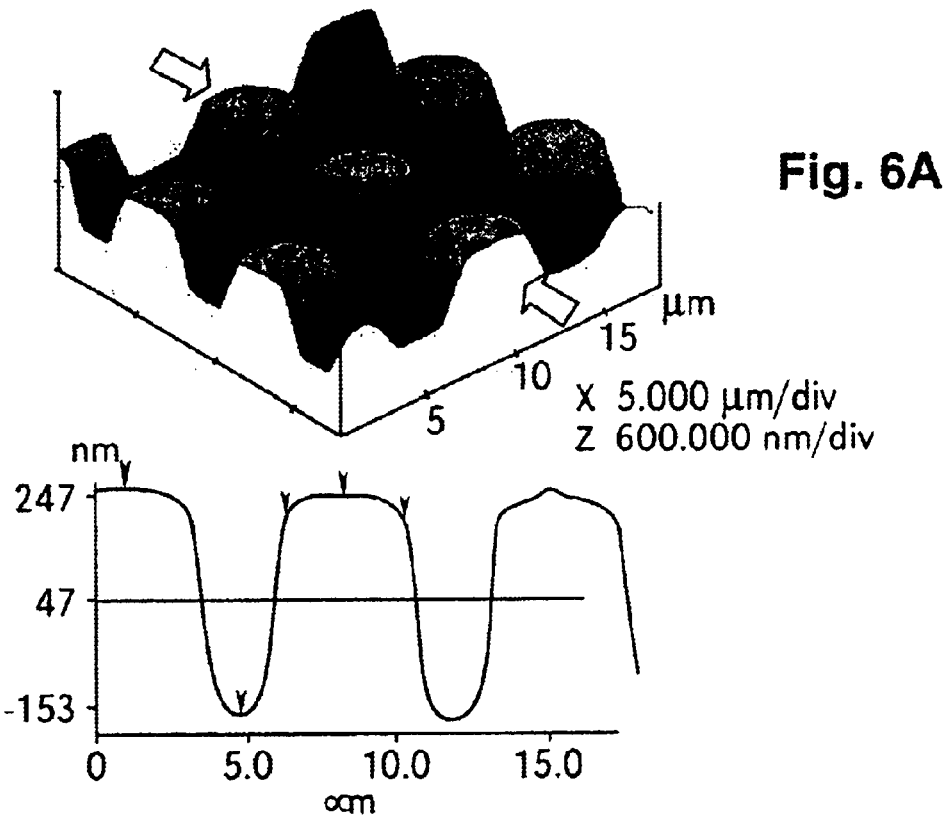
FIG. 6 is a SEM photograph of a polycarbonate polymeric ink formed by inking a dot pattern onto a silicon wafer.
Figure 6B:
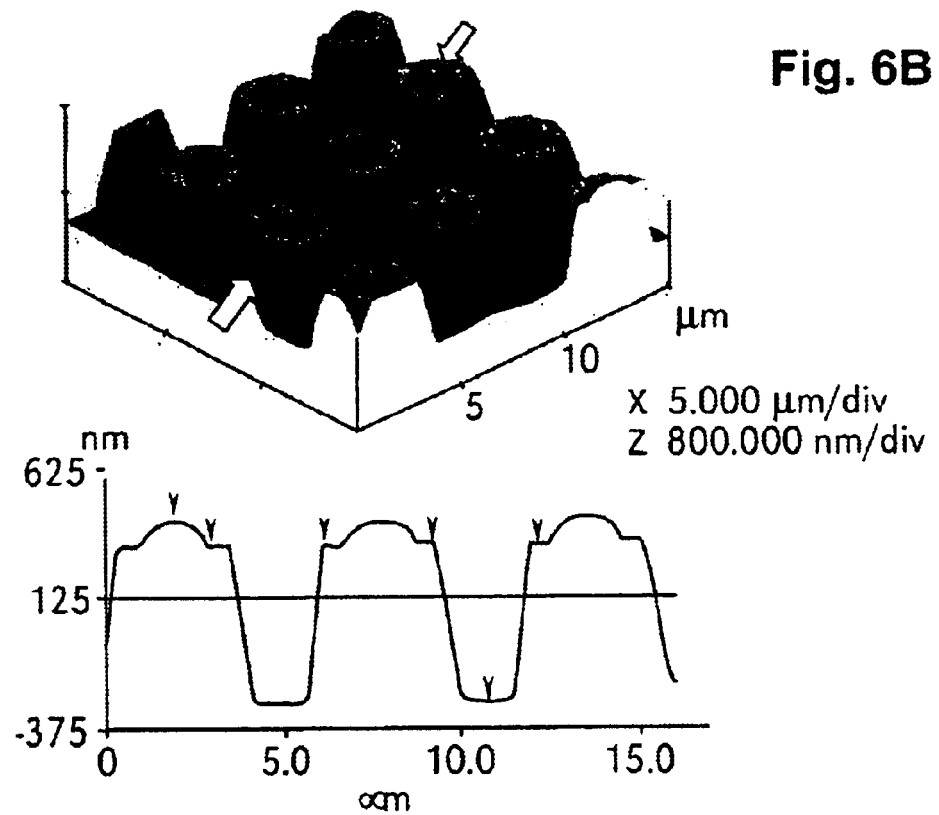

For thin polycarbonate (PC, Lexan® ML6155-111N, $M_w$=18 k, $T_g$=150° C.) coatings on selective PETS/FDTS treated micrometer-sized molds, continuous PC film covers the 500 nm deep mold (FIG. 6(a)) after spin coating. When a relatively deep mold is used, however, isolated polymer islands are formed on the protrusions directly after spin coating. FIG. 6 compares the AFM scans of PC coated 500 mm and 720 nm deep molds. When a deep mold is coated with a polymer solution, the coating thickness on the sidewalls is likely to be very small. Spontaneous dewetting is then possible to occur on the sidewalls during spin coating, resulting in a discontinued coverage as shown in FIG. 6(b).

Figure 7:
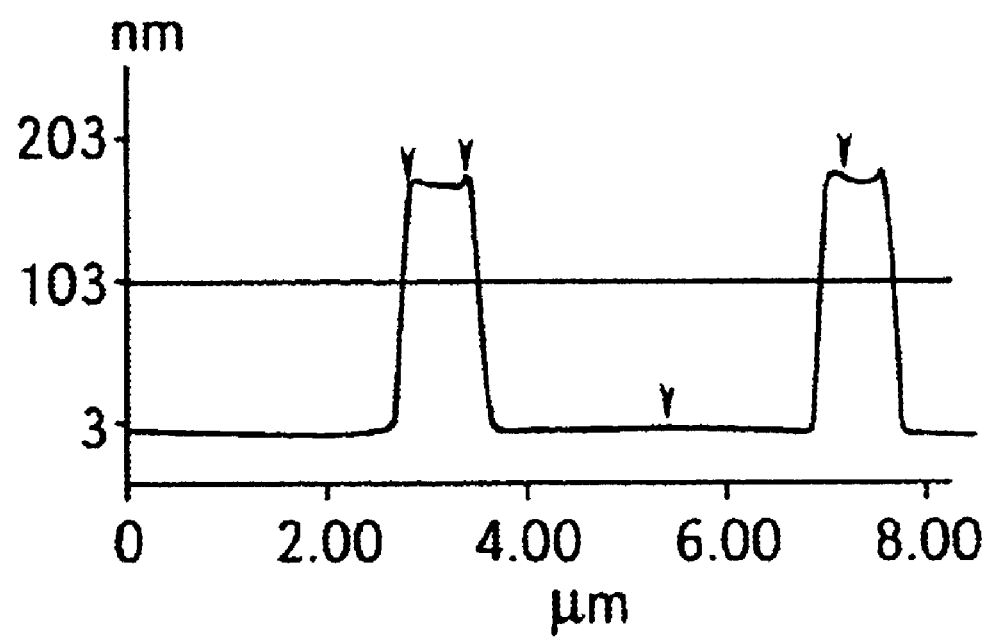
FIG. 7 is an SEM photograph of submicrometer pattern formed by inking PC coated mold with 2 $\mu$m protruded circles. The PC is annealed at 170° C. for 2 min.
Figure 7:
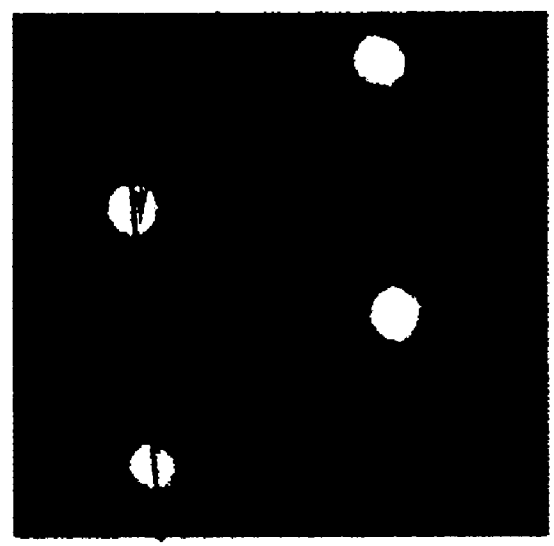

The polymer islands on protrusions continue to shrink during annealing until the equilibrium contact angle is reached, the resulted dimension change is around 60%. As a result, the inked features are usually much smaller than those on the mold. In fact, this offers a viable method to obtain submicrometer features using a mold with much larger feature size. FIG. 7 presents such an example. Polycarbonate dots with a diameter of 500 to 600 nm can be obtained using a mold with 2 μm diameter protruded circles. Interestingly, it has also been found that polymer patterns can be inked without the need for annealing before inking. Inked patterns for unannealed polymer show similar profiles and dimensions as those inked with annealed polymer. This indicates that despite the high pressure of 5 MPa applied during inking, the material on protrusions of the mold can still dewet and shrink, for both annealed and unannealed polymer films.

The selective surface treatment strategy described herein relies on controlled polymer dewetting to obtain smooth feature edges in inked polymer patterns. As a result, all inked films illustrated herein are very thin (100–200 nm). This limits the ability of polymer inking to form high aspect ratio structures directly. However, higher aspect ratios can be achieved by using a bi-layer resist strategy. The inking polymer can be chosen to have much higher dry etch resistance than typical organic polymers. One example of such etch resistant polymer is silicon-containing polymers. A shallow pattern of a silicon-containing polymer can be inked on a thick organic polymer layer. The pattern of the top layer can them be transferred to the bottom layer by reactive ion etching (RIE).

Although the foregoing examples and description are intended to be representative of the invention, they are not intended to in any way limit the scope of the appended claims.

What is claimed is:

1. A method of creating a pattern on a substrate:
    a) applying a first surface energy modifier to an applicator to form a coating of said first surface energy modifier on the applicator;
    b) contacting the coating with a transfer member, the transfer member having a topography comprising a plurality of protrusions and a plurality of recesses, the coating only contacting and remaining on at least some of the protrusions but not any of the recesses, thus forming a first modified transfer member having surface modified protrusions;
    c) exposing the first modified transfer member to a second surface energy modifier, thereby forming a second modified transfer member having modified recesses and differential surface energy on the surface modified protrusions and surface modified recesses, wherein the second surface energy modifier creates a surface energy on a silicon wafer that has lower surface energy of the same silicon wafer treated with said first surface energy modifier;
    d) applying a composition comprising a polymeric material to the second modified transfer member, the composition substantially conforming to the topography of the surface modified protrusions and the surface modified recesses to form composition-coated, surface-modified protrusions and composition-coated surface modified recesses; and
    e) with or without annealing over $T_g$ after step (d), contacting the composition-coated, surface modified protrusions with a substrate having a surface for certain period of time and under appropriate pressure and temperature to transfer the polymeric material from the transfer member to the substrate surface.

2. The method of claim 1 wherein the first surface energy modifier is a silane.

3. The method of claim 2 wherein the silane is selected from the group consisting of organosilanes described by formula $R_n SiX_{4-n}$, where R is a functional or nonfunctional group; X is a group which is reactive, and/or which is hydrolyzable into a group which is reactive, with a hydroxyl group, and n=1, 2 or 3.

4. The method of claim 3 wherein the silane is PETS or MOPTS.

5. The method of claim 1 wherein the second surface energy modifier is a silane.

6. The method of claim 5 wherein the second surface energy modifier is a silane of the general formula $R_n SiX_{4-n}$, where R is a functional or nonfunctional group; X is a group which is reactive, and/or which is hydrolyzable into a group which is reactive, with a hydroxyl group, and n=1, 2 or 3.

7. The method of claim 6 wherein the second surface energy modifier is 1H,1H,2H,2H-perfluorodecyltrichlorosilane.

8. The method of claim 1 wherein the applicator comprises an elastomer.

9. The method of claim 8 wherein the elastomer is a polydimethylsiloxane.

10. The method of claim 1 wherein the transfer member is a hard mold containing a desired pattern or relief for a micro-/nano-structure.

11. The method of claim 10 wherein the mold comprises a material selected from the group consisting of semiconductors, dielectrics, polymers, metals and their combinations and a material whose surface has been modified to create hydroxyl groups thereon, for example by a chemical oxidizing treatment or with a plasma, or alternatively coated with a layer of glass, silica or metal by techniques such as sputtering, chemical deposition in the vapor phase, or sol gel.

12. The method of claim 1 wherein the transfer member has a pattern produced by a process selected form the group consisting of molding, etching through a mask, photolithography, x-ray lithography, nanoimprint lithography (NIL), and combinations of the aforementioned.

13. The method of claim 1 wherein the polymeric material consist of relatively soft materials compared to the transfer member, including thermoplastic polymers, thermal/irradiative curable prepolymers, and glass or ceramic precursors.

14. The method of claim 13 wherein the polymer is selected from the group consisting of poly(methyl methacrylate) and polycarbonate.

15. The method of claim 1 wherein the substrate is selected from the group consisting of polymers, semiconductors, dielectrics, silicon components, metals, and combinations thereof.

16. The method of claim 15 wherein the substrate surface has been modified by a technique selected from the group consisting of a chemical oxidizing treatment, a plasma, coated with a layer of glass, silica or metal by techniques such as sputtering, chemical deposition in the vapor phase, or sol gel.

17. The method of claim 1 wherein the substrate has varied three-dimensional forms substantially perpendicular to a plane of the substrate.

18. The method of claim 1 wherein the substrate bears a pattern produced by a process selected from the group consisting of molding, etching through a mask, photolithography, x-ray lithography, and combinations of the aforementioned.

19. The method of claim 1 wherein the surface of the substrate may be smooth, coarse, or porous.

20. The method of claim 1 wherein submicrometer dimension patterns can be achieved on the substrate by controlled dewetting of polymer from the second modified transfer member, the second modified transfer member protrusions having micrometer-sized dimensions.

21. A method of patterning a substrate, the method comprising the steps of:
  a) applying a first surface energy modifier to an applicator to form a coating of said first surface energy modifier on the applicator;
  b) contacting the coating with a transfer member, the transfer member having a topography comprising a plurality of protrusions and a plurality of recesses, the coating only contacting and remaining on at least some of the protrusions but not any of the recesses, thus forming a first modified transfer member having surface modified protrusions;
  c) exposing the first modified transfer member to a second surface energy modifier, thereby forming a second modified transfer member having modified recesses and differential surface energy on the surface modified protrusions and surface modified recesses, wherein the second surface energy modifier creates a surface energy on a silicon wafer that has lower surface energy of the same silicon wafer treated with said first surface energy modifier;
  d) applying a composition comprising a polymeric material to the second modified transfer member, the composition substantially conforming to the topography of the surface modified protrusions and the surface modified recesses to form composition-coated, surface-modified protrusions and composition-coated surface modified recesses; and
  e) with or without annealing over $T_g$ after step (d), contacting the composition-coated, surface modified protrusions with a substrate for certain period of time and under appropriate pressure and temperature to transfer the polymeric material from the transfer member to the substrate; and
  f) exposing the product of step e) to reactive ion etching to transfer the pattern into the substrate.

22. A method of forming high aspect ratio, polymer inked features on a substrate, the method comprising the steps of:
  a) applying a first surface energy modifier to an applicator to form a coating of said first surface energy modifier on the applicator;
  b) contacting the coating with a transfer member, the transfer member having a topography comprising a plurality of protrusions and a plurality of recesses, the coating only contacting and remaining on at least some of the protrusions but not any of the recesses, thus forming a first modified transfer member having surface modified protrusions;
  c) exposing the first modified transfer member to a second surface energy modifier, thereby forming a second modified transfer member having modified recesses and differential surface energy on the surface modified protrusions and surface modified recesses, wherein the second surface energy modifier creates a surface energy on a silicon wafer that has lower surface energy of the same silicon wafer treated with said first surface energy modifier;
  d) applying a composition comprising a polymeric material to the second modified transfer member, the composition substantially conforming to the topography of the surface modified protrusions and the surface modified recesses to form composition-coated, surface-modified protrusions and composition-coated surface modified recesses, the polymeric material selected to have much higher dry etch resistance than an organic polymer layer on a substrate to which the polymeric material is applied in step (e);
  e) contacting the composition-coated, surface modified protrusions with a substrate for certain period of time and under conditions sufficient to transfer a pattern of the polymeric material from the transfer member to the organic layer on the substrate; and
  f) exposing the product of step (e) to reactive ion etching to extend the pattern to the organic layer.

* * * * *